US012681050B2

(12) United States Patent
Fukuhara

(10) Patent No.: US 12,681,050 B2
(45) Date of Patent: Jul. 14, 2026

(54) CURRENT SENSOR

(71) Applicant: Yazaki Corporation, Tokyo (JP)

(72) Inventor: Toshiaki Fukuhara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 143 days.

(21) Appl. No.: 18/601,455

(22) Filed: Mar. 11, 2024

(65) Prior Publication Data

US 2024/0329097 A1 Oct. 3, 2024

(30) Foreign Application Priority Data

Mar. 29, 2023 (JP) .................................. 2023-053220

(51) Int. Cl.
G01R 15/20 (2006.01)
(52) U.S. Cl.
CPC .................................. G01R 15/207 (2013.01)
(58) Field of Classification Search
CPC .................................................. G01R 15/207
See application file for complete search history.

(56) References Cited

U.S. PATENT DOCUMENTS

| | | | |
|---|---|---|---|
| 2013/0127456 A1 | 5/2013 | Hebiguchi | |
| 2015/0115938 A1* | 4/2015 | Kasajima | G01R 33/09 |
| | | | 324/207.18 |
| 2019/0293733 A1* | 9/2019 | Esaka | G01R 33/0076 |

FOREIGN PATENT DOCUMENTS

| | | | | |
|---|---|---|---|---|
| JP | 2005-195427 A | | 7/2005 | |
| JP | 2009-276359 A | | 11/2009 | |
| JP | 2014-235045 A | | 12/2014 | |
| JP | 2019027875 A | * | 2/2019 | |
| WO | WO-2014203862 A2 | * | 12/2014 | G01R 15/207 |

* cited by examiner

*Primary Examiner* — Feba Pothen
(74) *Attorney, Agent, or Firm* — Sughrue Mion, PLLC

(57) ABSTRACT

A current sensor includes a busbar, a first magnetic sensor, and a first coil, and where a longitudinal direction of the busbar is defined as an X axis direction, and a width direction of the busbar is defined as a Y axis direction, the first magnetic sensor measures a magnetic field in the Y axis direction, the first coil is arranged such that an axis of the first coil is parallel to the Y axis direction, and the first magnetic sensor is arranged inside the first coil.

7 Claims, 6 Drawing Sheets

FIG. 4

CURRENT SENSOR

TECHNICAL FIELD

The present invention relates to a current sensor.

BACKGROUND

A magnetic balance type current sensor has been developed (for example, Patent Document 1). As illustrated in FIG. 6, a conventional magnetic balance type current sensor includes a bus bar, a magnetic core, a magnetic sensor, a current converter, a coil, and a measuring resistor. The magnetic sensor outputs a voltage the value of which is proportional to the magnetic field generated inside the magnetic core due to the current in question flowing through the bus bar, and the current converter converts this voltage into a feedback current. This feedback current is adjusted so that the magnetic field generated inside the magnetic core due to the feedback current flowing through the coil cancels the magnetic field generated inside the magnetic core due to the current in question flowing through the bus bar. Therefore, the value of the feedback current is proportional to the value obtained by multiplying the value of the current in question by the reciprocal (1/N) of the number of turns N of the coil.

RELATED ART

Patent Document

Patent Document 1: JP 2014-235045 A

SUMMARY OF THE INVENTION

Problem to be Solved by the Invention

In the magnetic balance type current sensor, as explained above, the value of the feedback current is proportional to the value of the current in question. Therefore, when a large current flows through the bus bar, the value of the feedback current increases. As explained above, the value of the feedback current is also proportional to the reciprocal (1/N) of the number of turns N of the coil. Therefore, by increasing the number of turns N of the coil, it is possible to alleviate the increase in this feedback current. However, if the number of turns N of the coil is increased, the manufacturing cost and the size of the current sensor will increase.

Therefore, it is an object of the present invention to provide a magnetic balance type current sensor that is low in cost, has a compact configuration, and is capable of handling large currents.

Solution to Problem

In order to solve the above problem, a current sensor according to an embodiment of the present invention includes a busbar, a first magnetic sensor, and a first coil, wherein where a longitudinal direction of the busbar is defined as an X axis direction, and a width direction of the busbar is defined as a Y axis direction, the first magnetic sensor measures a magnetic field in the Y axis direction, the first coil is arranged such that an axis of the first coil is parallel to the Y axis direction, and the first magnetic sensor is arranged inside the first coil.

Advantageous Effects of the Invention

According to the present invention, a magnetic balance type current sensor that is low in cost, has a compact configuration, and is capable of handling large currents can be provided.

BRIEF DESCRIPTION OF THE DRAWINGS

FIG. 4 is a view illustrating, in a plane perpendicular to the X axis direction, the direction of a magnetic field generated inside an area surrounded by a first shield member 140 and a second shield member 150 due to an external magnetic field.

DETAILED DESCRIPTION OF THE EXEMPLARY EMBODIMENT

<Current Sensor 100>

Figure 1:
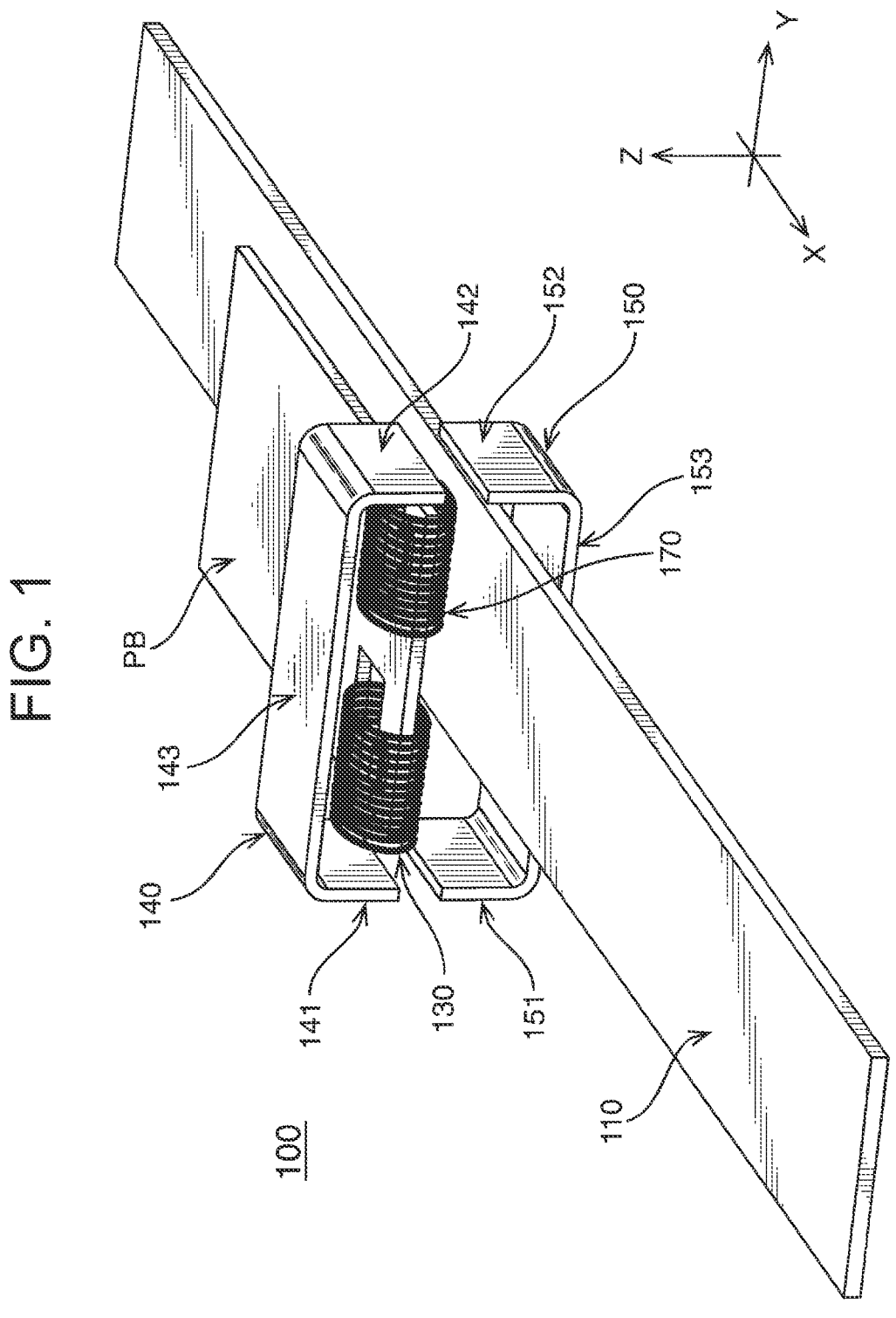
FIG. 1 is a view illustrating a current sensor 100 according to an embodiment of the present invention.
Figure 2:
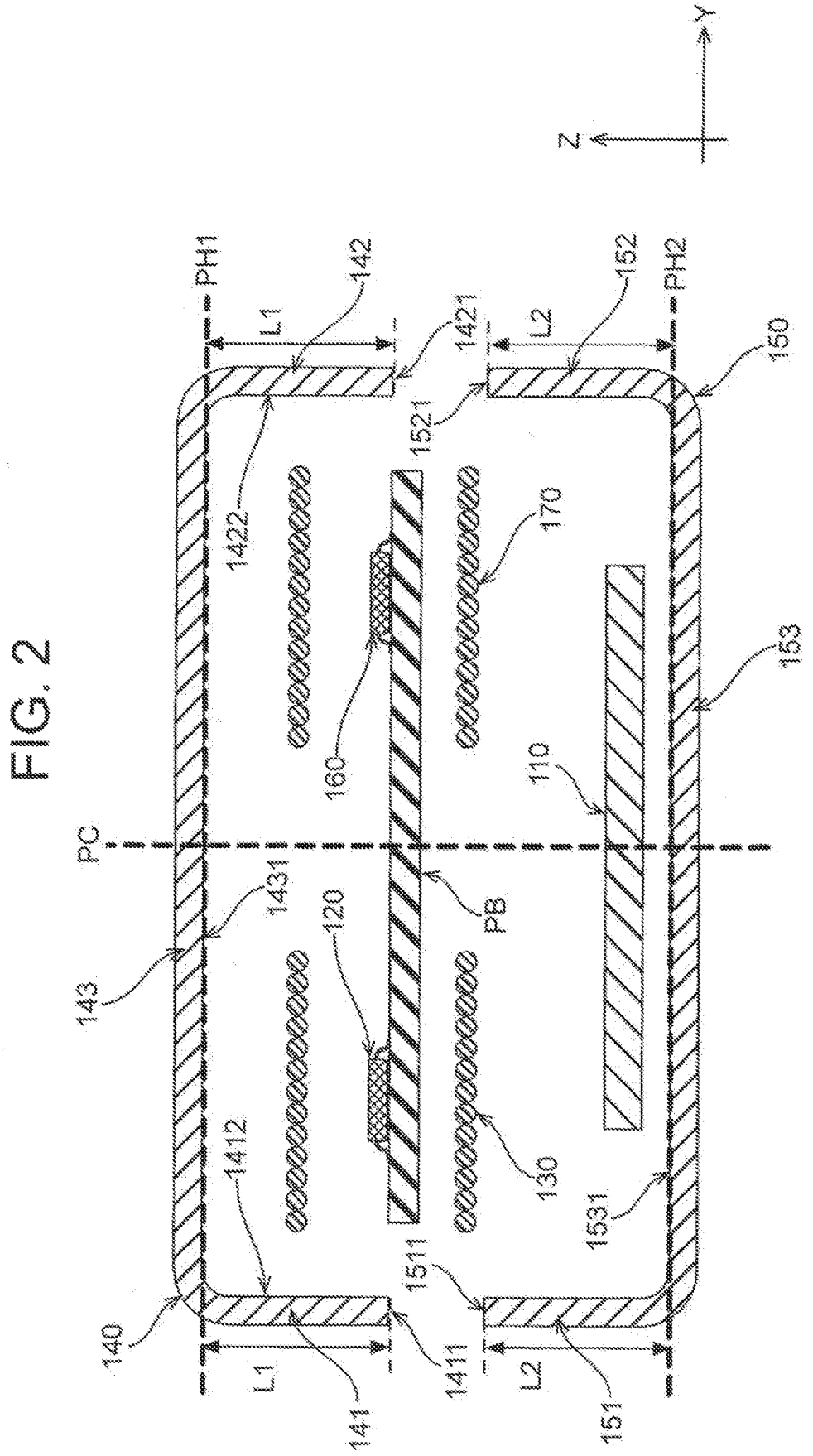
FIG. 2 is a cross-sectional view of the current sensor 100 taken along a plane perpendicular to the X axis direction at a position where first magnetic sensor 120 is present.

FIG. 1 is a view illustrating a current sensor 100 according to an embodiment of the present invention. The current sensor 100 includes a busbar 110, a first magnetic sensor 120, and a first coil 130. In the present embodiment, the longitudinal direction of the busbar 110 is defined as the X axis direction, the width direction of the busbar 110 is defined as the Y axis direction, and the direction perpendicular to the longitudinal direction and the width direction of the busbar 110 is defined as the Z axis direction. A plane formed of lines parallel to the X axis direction and lines parallel to the Y axis direction is defined as a horizontal plane. FIG. 2 is a cross-sectional view of the current sensor 100 taken along a plane perpendicular to the X axis direction at a position where first magnetic sensor 120 is present.

The busbar 110 is made of an electrical conductor. A current in question that is to be measured flows through the busbar 110.

The first magnetic sensor 120 is a magnetic sensor that measures a magnetic field in the Y axis direction, and is, for example, a Hall element or a magnetoresistive element. The Hall element is an element that utilizes the Hall effect and outputs a voltage proportional to the magnetic field. The magnetoresistive element is an element that measures the size of a magnetic field by utilizing a magnetoresistive effect, and is, for example, a giant magneto resistance (GMR) element or a tunnel magneto resistance (TMR) element. The first magnetic sensor 120 is provided on a circuit board PB, for example, as illustrated in FIG. 2.

The first coil 130 is a coil the axis of which is parallel to the Y axis direction, and the first magnetic sensor 120 is provided inside this first coil 130, as illustrated in FIG. 2.

Figure 3:
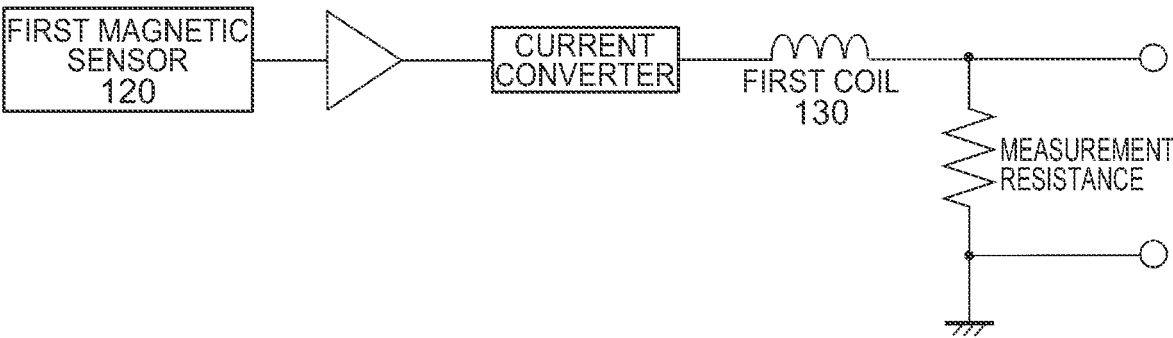
FIG. 3 is a diagram illustrating a magnetic balance type current sensor including a first magnetic sensor 120 and a first coil 130.

For example, as illustrated in FIG. 3, the first magnetic sensor 120 and the first coil 130 constitute a magnetic balance type current sensor. The direction of the current flowing through the first coil 130 is set such that, in the inside of the first coil 130, the direction of the magnetic field generated due to the current flowing through the first coil 130 is opposite to the direction of the magnetic field generated due to the current flowing through the busbar 110.

In the magnetic balance type current sensor including the first magnetic sensor 120 and the first coil 130, the first magnetic sensor 120 outputs a voltage having a voltage value proportional to the magnetic field generated by the current in question flowing through the busbar 110 (i.e. a voltage value proportional to the value of the current in question). The voltage output from the first magnetic sensor 120 is amplified by an amplifier (for example, an operational amplifier) and then converted to a feedback current by a current converter, and this feedback current flows through the first coil 130.

As explained above, the current sensor 100 according to the present embodiment does not have a magnetic core, and the first magnetic sensor 120 directly measures the magnetic field generated by the current flowing through the busbar 110. Therefore, in the present embodiment, even if a large current flows through the busbar 110, it is possible to prevent the feedback current from increasing as compared with a current sensor having a magnetic core. Furthermore, since the present embodiment does not have a magnetic core, it is possible to reduce manufacturing costs. As a result, the present embodiment can provide a magnetic balance type current sensor that is low in cost, has a compact configuration, and is capable of handling large currents.

<Shield Members 140, 150>

In order to shield the external magnetic field (magnetic fields other than the magnetic field generated by the current flowing through busbar 110), the current sensor 100 preferably further includes a first shield member 140 and a second shield member 150. The first shield member 140 and the second shield member 150 are made of, for example, soft magnetic materials.

The first shield member 140 includes a first portion 141, a second portion 142, and a third portion 143. The first portion 141 and the second portion 142 of the first shield member 140 extend in the X axis direction and the Z axis direction. The third portion 143 of the first shield member 140 extends in the X axis direction and the Y axis direction. The first portion 141 is connected to one end, in the Y axis direction, of the third portion 143 of the first shield member 140, and the second portion 142 is connected to the other end thereof. Therefore, the cross-section of the first shield member 140 is in a U shape as illustrated in FIG. 2.

Furthermore, the second shield member 150 includes a first portion 151, a second portion 152, and a third portion 153. The first portion 151 and the second portion 152 of the second shield member 150 extend in the X axis direction and the Z axis direction. The third portion 153 of the second shield member 150 extends in the X axis direction and the Y axis direction. The first portion 151 is connected to one end, in the Y axis direction, of the third portion 153 of the second shield member 150, and the second portion 152 is connected to the other end thereof. Therefore, the cross-section of the second shield member 150 is in a U shape as illustrated in FIG. 2.

As illustrated in FIG. 2, the length, in the Y axis direction, of the first shield member 140 is the same as the length, in the Y axis direction, of the second shield member 150. As illustrated in FIG. 2, the first shield member 140 and the second shield member 150 are arranged such that an end portion 1411 of the first portion 141 of the first shield member 140 and an end portion 1511 of the first portion 151 of the second shield member 150 face each other, and an end portion 1421 of the second portion 142 of the first shield member 140 and an end portion 1521 of the second portion 152 of the second shield member 150 face each other.

A distance (a first distance L1) between the end portion 1411 of the first portion 141 of the first shield member 140 and a horizontal plane PH1 containing an inner surface (i.e., one surface on the side of the first magnetic sensor 120 of the two surfaces of the third portion 143 extending in the X axis direction and the Y axis direction) 1431 of the third portion 143 of the first shield member 140 is, as illustrated in FIG. 2, the same as the distance between the end portion 1421 of the second portion 142 of the first shield member 140 and the horizontal plane PH1. In other words, a length, in the Z axis direction, of the first portion 141 of the first shield member 140 is the same as a length, in the Z axis direction, of the second portion 142 of the first shield member 140.

A distance (a second distance L2) between the end portion 1511 of the first portion 151 of the second shield member 150 and a horizontal plane PH2 containing an inner surface (i.e., one surface on the side of the first magnetic sensor 120 of the two surfaces of the third portion 153 extending in the X axis direction and the Y axis direction) 1531 of the third portion 153 of the second shield member 150 is the same as the distance between the end portion 1521 of the second portion 152 of the second shield member 150 and the horizontal plane PH2. In other words, a length, in the Z axis direction, of the first portion 151 of the second shield member 150 is the same as a length, in the Z axis direction, of the second portion 152 of the second shield member 150.

As illustrated in FIGS. 1 and 2, the busbar 110, the first magnetic sensor 120, and the first coil 130 are arranged inside the area bounded by the first shield member 140 and the second shield member 150. Accordingly, the current sensor 100 according to the present embodiment can measure the current in question flowing through the busbar while reducing the influence of an external magnetic field.

Figure 4:
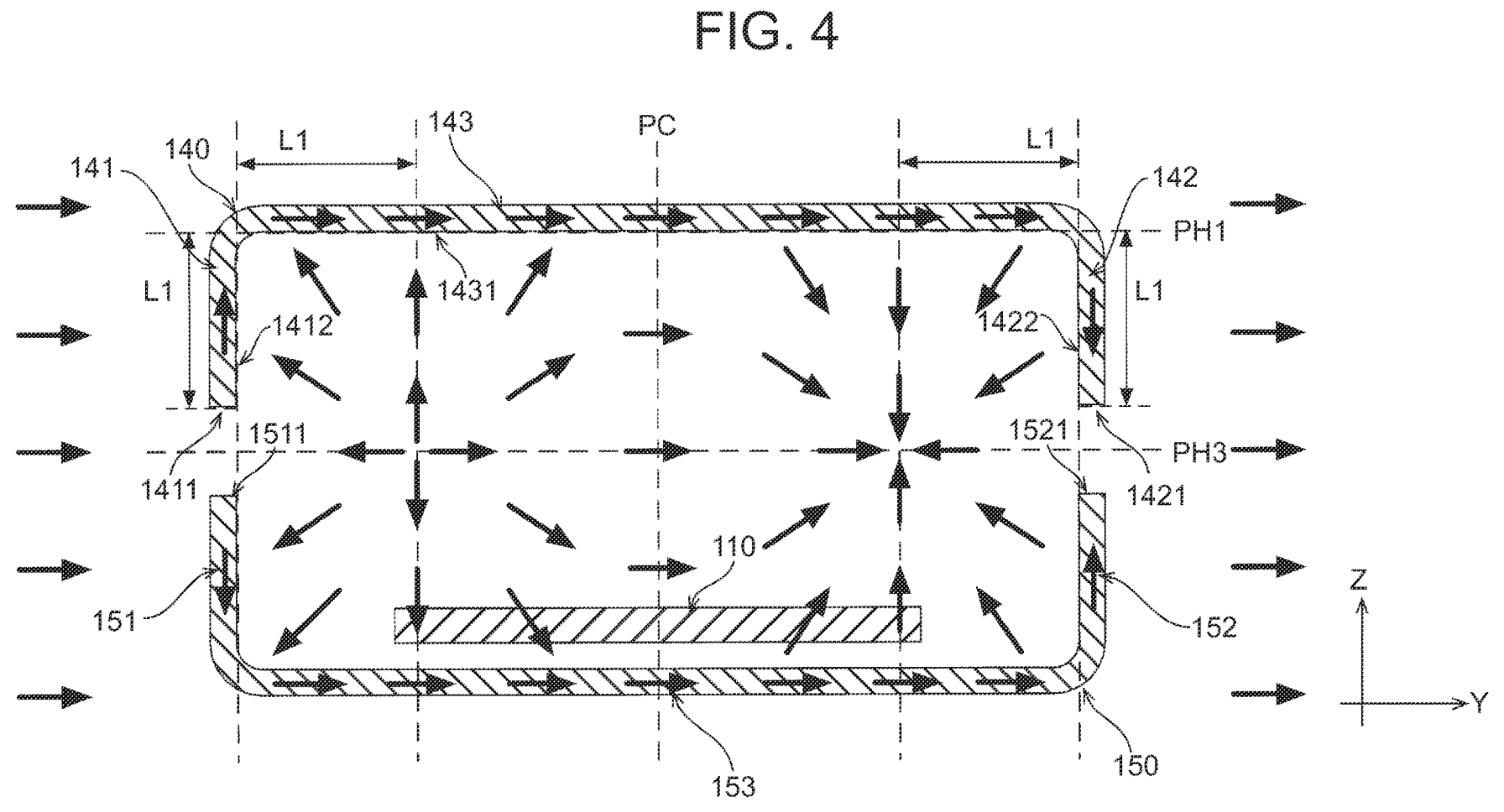

FIG. 4 is a view illustrating, in the plane perpendicular to the X axis direction, the direction of a magnetic field generated inside the area surrounded by the first shield member 140 and the second shield member 150 due to the external magnetic field. As illustrated in FIG. 4, the magnetic field generated by the external magnetic field is oriented in the Y axis direction on a central plane PC. The central plane PC is a plane formed of: a line passing through the center, in the Y axis direction, of the third portion 143 of the first shield member 140 and the center, in the Y axis direction, of the third portion 153 of the second shield member 150; and a line parallel to the X axis direction.

Accordingly, as illustrated in FIG. 2, the position, in the Y axis direction, of the first magnetic sensor 120 may be out of the central plane PC. In this case, the current flowing through the busbar can be measured while the influence of external magnetic field is reduced.

As illustrated in FIG. 4, in a plane perpendicular to the X axis direction, on a line situated away in the Y axis direction by the first distance L1 from an inner surface (i.e., one surface on the side of the first magnetic sensor 120 of the two surfaces of the first portion 141 extending in the X axis direction and the Z axis direction) 1412 of the first portion 141 of the first shield member 140, the magnetic field generated by the external magnetic field is oriented in the Z axis direction, and the Y axis component of the magnetic field generated by the external magnetic field is zero.

Accordingly, as illustrated in FIG. 2, in the plane perpendicular to the X axis direction, the first magnetic sensor 120 may be arranged near a line situated away by the first distance L1 from the inner surface 1412 of the first portion

141 of the first shield member 140. In other words, a distance between the first magnetic sensor 120 (for example, the center of the sensor area of the first magnetic sensor 120) and a plane situated away by the first distance L1 from the inner surface 1412 of the first portion 141 of the first shield member 140 may be within a first value. The first value may be arranged as appropriate. In this case, the current in question flowing through the busbar can be measured while the influence of external magnetic field is reduced.

Furthermore, as illustrated in FIG. 4, in the plane perpendicular to the X axis direction, the magnetic field generated by the external magnetic field is oriented in the Y axis direction at a position that is near the line situated away by the first distance L1 from the inner surface 1412 of the first portion 141 of the first shield member 140 and that is near a horizontal plane PH3 containing the center between the end portion 1411 of the first portion 141 of the first shield member 140 and the end portion 1511 of the first portion 151 of the second shield member 150 and the center between the end portion 1421 of the second portion 142 of the first shield member 140 and the end portion 1521 of the second portion 152 of the second shield member 150.

Accordingly, as illustrated in FIG. 2, the first magnetic sensor 120 may be arranged at a position away from the position near the horizontal plane PH3. In other words, a distance between the first magnetic sensor 120 (for example, the center of the sensor area of the first sensor 120) and the horizontal plane PH3 may be equal to or more than a second value. The second value may be arranged as appropriate. In this case, the current in question flowing through the busbar can be measured while the influence of external magnetic field is reduced.

The first distance L1 that is a distance between the end portion 1411 of the first portion 141 of the first shield member 140 and the horizontal plane PH1 may be equal to or more than a second distance L2 that is a distance between the end portion 1511 of the first portion 151 of the second shield member 150 and the horizontal plane PH2. In other words, a length, in the Z axis direction, of the first portion 141 of the first shield member 140 may be equal to or more than a length, in the Z axis direction, of the first portion 151 of the second shield member 150. In this case, of the area surrounded by the first shield member 140, an area in which the Y axis component of the magnetic field extends. As a result, the arrangement of the first magnetic sensor 120 becomes easier.

<Second Magnetic Sensor 160, Second Coil 170>

As illustrated in FIGS. 1, 2, the current sensor 100 may include a second magnetic sensor 160 and a second coil 170.

The second magnetic sensor 160 is a magnetic sensor that measures a magnetic field in the Y axis direction, and is, for example, a Hall element or a magnetoresistive element. The second magnetic sensor 160 is provided on a circuit board PB, for example, as illustrated in FIG. 2.

The second coil 170 is a coil the axis of which is parallel to the Y axis direction, and the second magnetic sensor 160 is provided inside this second coil 170, as illustrated in FIG. 2.

Figure 5:
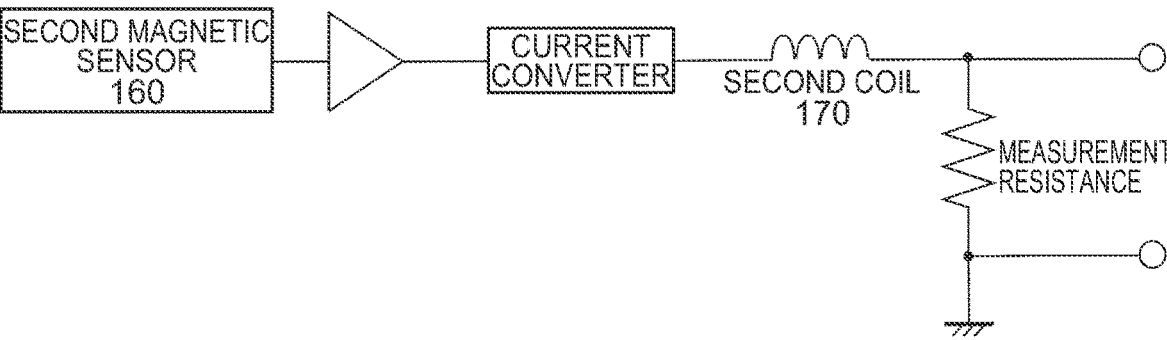
FIG. 5 is a diagram illustrating a magnetic balance type current sensor including a second magnetic sensor 160 and a second coil 170.
Figure 6:
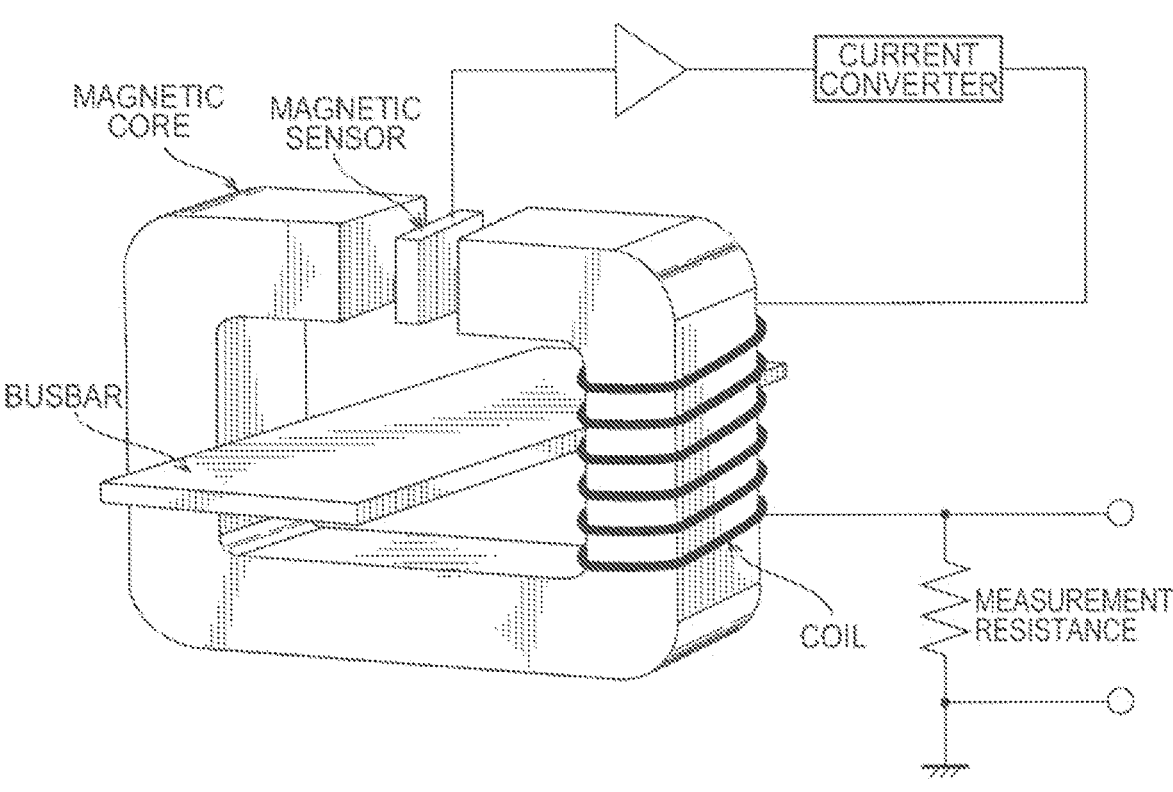
FIG. 6 is a view illustrating a conventional magnetic balance type current sensor.

For example, as illustrated in FIG. 5, the second magnetic sensor 160 and the second coil 170 constitute a magnetic balance type current sensor. The direction of the current flowing through the second coil 170 is set such that, in the inside of the second coil 170, the direction of the magnetic field generated due to the current flowing through the second coil 170 is opposite to the direction of the magnetic field generated due to the current flowing through the busbar 110.

In the magnetic balance type current sensor including the second magnetic sensor 160 and the second coil 170, the second magnetic sensor 160 outputs a voltage having a voltage value proportional to the magnetic field generated by the current in question flowing through the busbar 110 (i.e. a voltage value proportional to the value of the current in question). The voltage output from the second magnetic sensor 160 is amplified by an amplifier (for example, an operational amplifier) and then converted to a feedback current by a current converter, and this feedback current flows through the second coil 170.

In this manner, the current sensor 100 includes not only the magnetic balance type current sensor constituted by the first magnetic sensor 120 and the first coil 130 but also the magnetic balance type current sensor constituted by the second magnetic sensor 160 and the second coil 170. In other words, the current sensor is equipped with the two magnetic balance type current sensors, so that redundancy can be obtained.

As illustrated in FIG. 4, in the plane perpendicular to the X axis direction, on a line situated away in the Y axis direction by the first distance L1 from an inner surface (i.e., one surface on the side of the first magnetic sensor 120 of the two surfaces of the second portion 142 extending in the X axis direction and the Z axis direction) 1422 of the second portion 142 of the first shield member 140, the magnetic field generated by the external magnetic field is oriented in the Z axis direction, and the Y axis component of the magnetic field generated by the external magnetic field is zero.

Accordingly, as illustrated in FIG. 2, in the plane perpendicular to the X axis direction, the second magnetic sensor 160 may be arranged near a line situated away by the first distance L1 from the inner surface 1422 of the second portion 142 of the first shield member 140. In other words, a distance between the second magnetic sensor 160 (for example, the center of the sensor area of the second sensor 160) and a plane situated away by the first distance L1 from the inner surface 1422 of the second portion 142 of the first shield member 140 may be within a third value. The third value may be arranged as appropriate. In this case, the current in question flowing through the busbar can be measured using the second magnetic sensor 160 while the influence of external magnetic field is reduced.

Furthermore, as illustrated in FIG. 4, in the plane perpendicular to the X axis direction, the magnetic field generated by the external magnetic field is oriented in the Y axis direction at a position that is near the line situated away by the first distance L1 from the inner surface 1422 of the second portion 142 of the first shield member 140 and that is near a horizontal plane PH3.

Accordingly, as illustrated in FIG. 2, in the plane perpendicular to the X axis direction, the second magnetic sensor 160 may be arranged at a position away from the position near the horizontal plane PH3. In other words, a distance between the second magnetic sensor 160 (for example, the center of the sensor area of the second sensor 160) and the horizontal plane PH3 may be equal to or more than a fourth value. The fourth value may be arranged as appropriate. In this case, the current in question flowing through the busbar can be measured using the second magnetic sensor 160 while the influence of external magnetic field is reduced.

The present invention has been described above with reference to preferred embodiment of the present invention. Although the present invention has been described herein with reference to specific examples, various modifications and changes can be made to these examples without departing from the spirit and scope of the invention as set forth in the claims.

LIST OF REFERENCE SIGNS

100 current sensor
110 busbar
120 first magnetic sensor
130 first coil
140 first shield member
141 first portion of first shield member 140
1411 end portion of first portion 141
1412 inner surface of first portion 141
142 second portion of first shield member 140
1421 end portion of second portion 142
1422 inner surface of second portion 142
143 third portion of first shield member 140
1431 inner surface of third portion 143
150 second shield member
151 first portion of second shield member 150
1511 end portion of first portion 151
1512 inner surface of first portion 151
152 second portion of second shield member 150
1521 end portion of second portion 152
1522 inner surface of second portion 152
153 third portion of second shield member 150
1531 inner surface of third portion 153
160 second magnetic sensor
170 second coil

What is claimed is:

1. A current sensor comprising:
a busbar;
a first magnetic sensor;
a first coil;
a first shield member; and
a second shield member,
wherein a longitudinal direction of the busbar is defined as an X axis direction, and a width direction of the busbar is defined as a Y axis direction,
the first magnetic sensor measures a magnetic field in the Y axis direction,
the first coil is arranged such that an axis of the first coil is parallel to the Y axis direction, and
the first magnetic sensor is arranged inside the first coil,
wherein the first shield member includes a first portion, a second portion, and a third portion,
wherein a direction perpendicular to the X axis direction and the Y axis direction is defined as a Z axis direction,
the first portion and the second portion of the first shield member extend in the X axis direction and the Z axis direction,
the third portion of the first shield member extends in the X axis direction and the Y axis direction,
the first portion of the first shield member is connected to one end, in the Y axis direction, of the third portion of the first shield member,
the second portion of the first shield member is connected to the other end, in the Y axis direction, of the third portion of the first shield member,
the second shield member includes a first portion, a second portion, and a third portion,
the first portion and the second portion of the second shield member extend in the X axis direction and the Z axis direction,
the third portion of the second shield member extends in the X axis direction and the Y axis direction, the first portion of the second shield member is connected to one end, in the Y axis direction, of the third portion of the second shield member,
the second portion of the second shield member is connected to the other end, in the Y axis direction, of the third portion of the second shield member,
a length, in the Y axis direction, of the first shield member is the same as a length, in the Y axis direction, of the second shield member,
the first shield member and the second shield member are arranged such that an end portion of the first portion of the first shield member and an end portion of the first portion of the second shield member face each other, and an end portion of the second portion of the first shield member and an end portion of the second portion of the second shield member face each other, and
the busbar, the first magnetic sensor, and the first coil are arranged inside an area surrounded by the first shield member and second shield member,
wherein a position, in the Y axis direction, of the first magnetic sensor is out of a plane formed of: a line passing through a center, in the Y axis direction, of the third portion of the first shield member and a center, in the Y axis direction, of the third portion of the second shield member; and a line parallel to the X axis direction, and
wherein one surface, on a side of the first magnetic sensor, of two surfaces of the first portion of the first shield member extending in the X axis direction and the Z axis direction is defined as an inner surface of the first portion of the first shield member,
one surface, on a side of the first magnetic sensor, of two surfaces of the third portion of the first shield member extending in the X axis direction and the Y axis direction is defined as an inner surface of the third portion of the first shield member,
a plane formed of a line parallel to the X axis direction and a line parallel to the Y axis direction is defined as a horizontal plane, and
a distance between the end portion of the first portion of the first shield member and the horizontal plane containing the inner surface of the third portion of the first shield member is defined as a first distance,
in a plane perpendicular to the X axis direction, the first magnetic sensor is situated at the first distance from the inner surface of the first portion of the first shield member.

2. The current sensor according to claim 1, wherein one of two surfaces, on a side of the first magnetic sensor, of the third portion of the second shield member extending in the X axis direction and the Y axis direction is defined as an inner surface of the third portion of the second shield member,
the distance between the end portion of the first portion of the first shield member and the horizontal plane containing the inner surface of the third portion of the first shield member is the same as a distance between the end portion of the second portion of the first shield member and the horizontal plane containing the inner surface of the third portion of the first shield member, and
a distance between the end portion of the first portion of the second shield member and a horizontal plane containing the inner surface of the third portion of the second shield member is the same as a distance between the end portion of the second portion of the second shield member and the horizontal plane containing the inner surface of the third portion of the second shield member.

3. The current sensor according to claim 2, wherein a distance between the first magnetic sensor and a horizontal plane containing a center between the end portion of the first portion of the first shield member and the end portion of the first portion of the second shield member and a center between the end portion of the second portion of the first shield member and the end portion of the second portion of the second shield member is equal to or more than a second value.

4. The current sensor according to claim 2, wherein the distance between the end portion of the first portion of the first shield member and the horizontal plane containing the inner surface of the third portion of the first shield member is equal to or more than the distance between the end portion of the first portion of the second shield member and the horizontal plane containing the inner surface of the third portion of the second shield member.

5. The current sensor according to claim 1, further comprising:

a second magnetic sensor configured to measure a magnetic field in the Y axis direction, a second coil, wherein the second coil is arranged such that an axis of the second coil is parallel to the Y axis direction, and the second magnetic sensor is arranged inside the second coil.

6. The current sensor according to claim 5, wherein one surface, on a side of the first magnetic sensor, of two surfaces of the second portion of the first shield member extending in the X axis direction and the Z axis direction is defined as an inner surface of the second portion of the first shield member, a distance between the second magnetic sensor and a plane situated away by the first distance from the inner surface of the second portion of the first shield member is equal to or less than a third value.

7. The current sensor according to claim 6, wherein one surface, on a side of the first magnetic sensor, of two surfaces of the third portion of the second shield member extending in the X axis direction and the Y axis direction is defined as an inner surface of the third portion of the second shield member, the distance between the end portion of the first portion of the first shield member and the horizontal plane containing the inner surface of the third portion of the first shield member is the same as a distance between the end portion of the second portion of the first shield member and the horizontal plane containing the inner surface of the third portion of the first shield member, a distance between the end portion of the first portion of the second shield member and the horizontal plane containing the inner surface of the third portion of the second shield member is the same as a distance between the end portion of the second portion of the second shield member and the horizontal plane containing the inner surface of the third portion of the second shield member, and a distance between the second magnetic sensor and a horizontal plane containing a center between the end portion of the first portion of the first shield member and the end portion of the first portion of the second shield member and a center between the end portion of the second portion of the first shield member and the end portion of the second portion of the second shield member is equal to or more than a fourth value.

* * * * *